(12) United States Patent
Smathers et al.

(10) Patent No.: US 10,792,788 B2
(45) Date of Patent: Oct. 6, 2020

(54) OPTIMIZED TEXTURED SURFACES AND METHODS OF OPTIMIZING

(71) Applicant: Tosoh SMD, Inc., Grove City, OH (US)

(72) Inventors: David B. Smathers, Columbus, OH (US); Joseph W. Buckfeller, Powell, OH (US); John Holeman, Powell, OH (US); Justin K. Reed, Reynoldsburg, OH (US)

(73) Assignee: TOSOH SMD, INC., Grove City, OH (US)

( * ) Notice: Subject to any disclaimer, the term of this patent is extended or adjusted under 35 U.S.C. 154(b) by 0 days.

(21) Appl. No.: 15/029,674

(22) PCT Filed: Oct. 8, 2014

(86) PCT No.: PCT/US2014/059630
§ 371 (c)(1),
(2) Date: Apr. 15, 2016

(87) PCT Pub. No.: WO2015/061035
PCT Pub. Date: Apr. 30, 2015

(65) Prior Publication Data
US 2016/0229029 A1    Aug. 11, 2016

Related U.S. Application Data

(60) Provisional application No. 61/894,019, filed on Oct. 22, 2013.

(51) Int. Cl.
*C23C 14/34* (2006.01)
*B24C 1/08* (2006.01)
(Continued)

(52) U.S. Cl.
CPC ............... *B24C 1/08* (2013.01); *B24C 1/003* (2013.01); *C23C 14/3414* (2013.01);
(Continued)

(58) Field of Classification Search
CPC ............... C23C 14/3414; C23C 14/564; H01J 37/3491; H01J 37/3426
See application file for complete search history.

(56) References Cited

U.S. PATENT DOCUMENTS 4,362,640 A    12/1982 Schreiber
5,009,240 A    4/1991 Levi
(Continued)

FOREIGN PATENT DOCUMENTS

CN    1478214 A    2/2004
CN    101558186 A    10/2009
(Continued)

OTHER PUBLICATIONS

International Search Report and Written Opinion dated Mar. 10, 2015 for PCT/US2014/059630 filed Oct. 8, 2014.
(Continued)

*Primary Examiner* — Jason Berman
(74) *Attorney, Agent, or Firm* — Wegman Hessler (57) ABSTRACT

Methods for treating texturized surfaces of sputter targets in order to improve adhesion and retention of deposited particles thereon. The target surfaces may first be texturized by a precursor texturizing method such as bead blasting, grit blasting, plasma spraying, or a twin-wire-arc spraying (TWAS) method. The thus textured surface is then sprayed or blasted with ice particles to form an optimized textured surface. The ice particles may comprise sublimable particles such as frozen carbon dioxide or dry ice. Also, argon may be used as exemplary ice particles.

7 Claims, 5 Drawing Sheets

Process Flow (51) Int. Cl.
*B24C 1/00* (2006.01)
*C23C 14/56* (2006.01)
*H01J 37/34* (2006.01)

(52) U.S. Cl.
CPC ........ *C23C 14/564* (2013.01); *H01J 37/3417* (2013.01); *H01J 37/3426* (2013.01); *H01J 37/3435* (2013.01); *H01J 37/3491* (2013.01)

(56) References Cited

U.S. PATENT DOCUMENTS

| | | | |
|---|---|---|---|
| 5,209,028 A | | 5/1993 | McDermott et al. |
| 5,525,093 A | * | 6/1996 | Palmer, Jr. ............. B24C 1/003 134/7 |
| 6,203,406 B1 | | 3/2001 | Rose et al. |
| 6,416,389 B1 | | 7/2002 | Perry et al. |
| 6,500,758 B1 | | 12/2002 | Bowers |
| 6,530,823 B1 | | 3/2003 | Ahmadi et al. |
| 6,740,247 B1 | | 5/2004 | Han et al. |
| 6,890,246 B2 | | 5/2005 | Yamahura |
| 7,134,941 B2 | | 11/2006 | Boumerzoug et al. |
| 7,220,257 B1 | | 5/2007 | Lafontaine |
| 7,264,679 B2 | | 9/2007 | Schweitzer et al. |
| 7,442,112 B2 | | 10/2008 | Yoon |
| 7,655,496 B1 | | 2/2010 | Franklin et al. |
| 7,762,869 B2 | | 7/2010 | Yoon |
| 7,867,061 B2 | | 1/2011 | Elshout |
| 7,931,834 B2 | | 4/2011 | Mehta et al. |
| 8,173,228 B2 | | 5/2012 | Choi et al. |
| 8,277,288 B2 | | 10/2012 | Spivak et al. |
| 8,292,698 B1 | | 10/2012 | Shih et al. |
| 8,409,266 B2 | | 4/2013 | Lafontaine |
| 2003/0155235 A1 | | 8/2003 | Miyashita et al. |
| 2004/0089543 A1 | * | 5/2004 | Kim .................... C23C 14/3407 204/298.12 |
| 2005/0172984 A1 | | 8/2005 | Schweitzer et al. |
| 2005/0266777 A1 | | 12/2005 | Yoon |
| 2007/0178811 A1 | | 8/2007 | Sundaram et al. |
| 2007/0250050 A1 | | 10/2007 | LaFontaine |
| 2009/0011682 A1 | | 1/2009 | Mase |
| 2009/0039178 A1 | | 2/2009 | Yoon |
| 2010/0107982 A1 | | 5/2010 | Sato et al. |
| 2011/0265815 A1 | | 11/2011 | Mitake et al. |
| 2011/0282272 A1 | | 11/2011 | LaFontaine |
| 2013/0048488 A1 | | 2/2013 | Shufflebotham |
| 2014/0150819 A1 | * | 6/2014 | Shih .................. H01L 21/67051 134/6 |
| 2015/0279636 A1 | * | 10/2015 | Hosokawa .......... C23C 14/3407 204/298.13 |

FOREIGN PATENT DOCUMENTS

| | | |
|---|---|---|
| CN | 102844460 A | 12/2012 |
| EP | 0 786 311 A1 | 7/1997 |
| EP | 0 786 311 B1 | 6/2000 |
| EP | 1 303 226 A2 | 4/2003 |
| EP | 1 303 226 B1 | 9/2006 |
| EP | 2 305 425 A1 | 4/2011 |
| EP | 2 305 425 B1 | 11/2012 |
| JP | 3030287 B1 | 4/2000 |
| JP | 2002/146524 A | 5/2002 |
| JP | 2005/238059 A | 9/2005 |
| JP | 2005/538257 A | 12/2005 |
| TW | 200413552 A | 8/2004 |
| TW | 200914203 A | 4/2009 |
| WO | WO 01/17726 A1 | 3/2001 |
| WO | WO 02/07625 A2 | 1/2002 |
| WO | WO 02/07625 A3 | 1/2002 |
| WO | WO 2004/033742 A2 | 4/2004 |
| WO | WO 2008/117482 A1 | 2/2008 |
| WO | WO 2013/001205 A1 | 1/2013 |
| WO | WO 2013/001205 A9 | 1/2013 |
| WO | WO 2013/038084 A1 | 3/2013 |

OTHER PUBLICATIONS

International Preliminary Report on Patentability dated May 6, 2016 for PCT/US2014/059630 filed Oct. 8, 2014.
Rosenberg, R., "Increasing PVD Tool Uptime and Particle Control with Twin-Wire-Arc Spray Coatings", MicroMagazine.com, 10 pages, Mar. 2001.
Block Dry Ice on Demand, I3 IcePress—Consistent Quality Block Dry Ice, Whenever, Wherever, Cold Jet, 1 page.
Absolute Precision—I3 Microclean, Precision Cleaning and Product Finishing System, Cold Jet, 1 page.
English Translation of The Second Office Action issued by The Patent Office of the People's Republic of China dated Nov. 16, 2017 in CN 201480058088.0 filed Apr. 22, 2016.
English Translation of Comments of the Examiner and Search Report issued by The Patent Office of the People's Republic of China dated Nov. 16, 2017 in CN 201480058088.0 filed Apr. 22, 2016.
English Translation of Examination Report with a Search Report issued in Taiwan Patent Application No. 103135176 filed Oct. 9, 2014 issued by the Taiwan Intellectual Property Office dated Mar. 19, 2018.
English Translation of The First Office Action issued by The Patent Office of the People's Republic of China dated Apr. 19, 2017 in CN 201480058088.0 filed Apr. 22, 2016.
English Translation of Comments of the Examiner and Search Report issued by The Patent Office of the People's Republic of China dated Apr. 19, 2017 in CN 201480058088.0 filed Apr. 22, 2016.
First Office Action Notification of Reasons for Refusal issued in Japanese Patent Application No. 2016-525546 by the Japanese Patent Office dated Jun. 12, 2018.

* cited by examiner

Sample "A" SEM

Protruding Arc Spray as Generated During the Normal Arc Spray Process that could break and become a Source of Particles x200 x400 x500

FIG. 3

Sample "B" SEM

Arc spray texturized surface optimized by blasting with dry ice.

OPTIMIZED TEXTURED SURFACES AND METHODS OF OPTIMIZING

CROSS REFERENCE TO RELATED APPLICATION

This application claims the priority benefit of U.S. Provisional Patent Application Ser. No. 61/894,019 filed Oct. 22, 2013.

FIELD OF INVENTION

This invention relates to shields and target sidewalls and flanges used in sputtering processes and in particular to optimizing the textured surfaces of shields and target sidewalls and flanges.

BACKGROUND OF THE INVENTION

In typical sputtering processes, metal atoms, from a metal or metal alloy sputter target are deposited onto a substrate in a physical vapor deposition (PVD) atmosphere. Most of the sputtered metal atoms travel, as desired, directly to the substrate. However, a significant portion of the sputtered particles become scattered in the gas during the PVD process and can deposit on various unintended surfaces of the chamber, such as the shield, and target sidewall or flange.

The scattered sputtered particles that deposit onto the various undesired surfaces of the sputter chamber such as the shield or target sidewall and flange, tend to build-up and flake off during later sputtering processes. Deposition of scattered sputtered particles on the target is especially troublesome. For instance, the repeated heating and cooling of the target, including the undesired deposited particles on the sidewalls of the target, render flaking of the particles even more likely.

In many cases, these deleterious particles are propelled to the substrate. These particles on the wafer may create defects in the sputtered pattern that can lead to a failed circuit. Target lifetime should be determined primarily by target thickness. In practice, however, the target life is often limited by accumulation of deposits on the target, particularly on the sidewall portion.

A portion of the target can be made to overhang surfaces of the sidewalls to inhibit deposition of scattered particles on the sidewalls. Optionally, shields or portions of the target surfaces, such as sidewalls, and flanges may be textured. The basic strategy is to simply manipulate the surface geometry to provide only short distances for stress to build up in any deposited material on the textured surface.

Texturing methods include bead, or grit blasting. These blasting processes, however, result in the blasting material becoming embedded in the surface being textured. The embedded material may be released into the processing chambers due to the thermal cycling in particle generation, resulting in poor performance.

Improved texturing methods include plasma spraying, or twin-wire-arc spraying (TWAS, or "arc spraying"). In arc spraying and plasma spraying, a metal coating is sprayed onto target surfaces to increase the roughness of the sidewalls even more. In the TWAS process, two wires with an opposing electrical charge are fed through a motorized gun. As the wires are fed through the gun, they almost touch and create an electrical arc. A compressed gas is fed through an orifice behind the electrical arc, atomizing the metal and propelling it onto the surface to be coated. The arc sprayed surface provides a high surface area that limits stress build-up in stress sensitive deposition layers, such as titanium nitride or tantalum nitride and other stress-sensitive films. TWAS or plasma spraying may use any metal to coat target surfaces, but aluminum is typically preferred because of its coefficient of thermal expansion, it has good adhesive strength, and it creates rough surfaces. Since the deposited layers or films are not continuous, they expand and contract at the approximately the same rate as the arc-sprayed aluminum. This helps reduce particle flaking and generation of undesired particles during target deflection while processing wafers. Arc spraying, however, may result in inconsistent roughness of the surface metal coating. Due to the inconsistent roughness, the coating material may release from the original target surface due to stress or thermal cycling in the process chambers. In addition, the arc spray process may trap contaminants that reduce adhesion of the deposited particles or create cantilevered structures too weak to support deposited particles.

These shield and target alterations were intended to improve the performance of the target, while inhibiting accumulation and improving retention of undesirable deposit particles on the target, thereby increasing the useful life of a target. The alterations provide a textured surface, but do not fully resolve the issue of particle generation. Undesirable deposits must still be made to adhere to the target throughout its useful life.

SUMMARY OF THE INVENTION

It was surprisingly discovered that textured target surfaces may be optimized to improve adhesion and retention of deposited particles. Accordingly, methods for optimizing textured target surfaces are disclosed. The methods may be used with target surfaces that have been texturized using any method, including but not limited to the bead blasting, grit blasting, plasma spraying, or twin-wire-arc spraying (TWAS) methods described above. In one embodiment, the method may comprise spraying or blasting the textured surface with ice particles to form an optimized textured surface. The ice particles may be sublimable particles, such as frozen carbon dioxide or dry ice. In another embodiment, the ice particles may be argon. In yet another embodiment, the textured surface may be blasted with ice particles using a particle blasting device. The ice particles may be entrained in a carrier gas such as nitrogen or air. In another embodiment, the method may comprise reducing the amount of any cantilevered structures present in the textured surface to form an optimized textured surface.

In yet another embodiment, an optimized textured surface is disclosed wherein the textured surface was optimized using a method comprising blasting a textured surface with ice particles to form an optimized textured surface. The textured surface maybe texturized using at least one method selected from the group consisting of bead blasting, grit blasting, plasma spraying, twin-wire-arc spraying (TWAS), and combinations thereof. In yet another embodiment, the textured surface may comprise aluminum, aluminum alloys, and/or combinations thereof.

In another embodiment of the invention, a target assembly comprising a sputtering target with at least one sidewall and/or a flange with an optimized textured surface is disclosed. The sidewall and/or flange may be optimized using a method comprising blasting a textured surface with ice particles to form an optimized textured surface. The textured surface may be texturized using at least one method selected from the group consisting of bead blasting, grit blasting, plasma spraying, twin-wire-arc spraying (TWAS), and combinations thereof. The textured surface may comprise aluminum, aluminum alloys, and/or combinations thereof. In yet another embodiment, the amount of any cantilevered structures present in the textured surface may be reduced to form the optimized textured surface.

Advantages of the present invention will become more apparent to those skilled in the art from the following description of the embodiments of the invention which have been shown and described by way of illustration. As will be realized, the invention is capable of other and different embodiments, and its details are capable of modification in various respects.

DETAILED DESCRIPTION OF EXEMPLARY EMBODIMENTS

The optimized textured surfaces and methods of the present invention may be used with any textured surface within the sputter chamber. Such surfaces include, but are not limited to, shields and target sidewalls or flanges. The surfaces may be textured using any method, such as bead blasting, grit blasting, plasma spraying, arc spraying, or twin-wire-arc spraying (TWAS). Such texturing methods are well known to those of ordinary skill of the art and are not included for the sake of brevity.

The textured surface may be an arc sprayed surface comprised of, for example, Al or Cu or alloys thereof. The textured surface could also be provided by bead blasting, knurling, etching, machining or other conventional means. Additionally, foamed metals can be used. These materials themselves have textured surfaces by their very nature. Foamed Al, Ni, and Cu metals are commercially available.

The textured surfaces typically have inconsistent roughness and cantilevered structures that protrude from the textured surface like hairs or whiskers. These cantilevered structures may catch dust or other contaminants and may fall and contaminate wafer surfaces during sputtering. The cantilevered structures are often too weak to hold the particles that become deposited on them during sputtering. As the mass of the particles deposited on the cantilevered structures increases, the stresses on the structures also increases. Eventually the cantilevered structures may break-off and contaminate water surfaces.

The textured surfaces may be optimized by removing the cantilevered structures and other surface contamination thereby leaving a clean surface that still has a high surface area to limit stress build up in any deposited material. The disclosed methods remove the sharp and protruding features of a textured surface without disturbing the overall roughness such that the optimized textured surface still has the surface area for deposited particles to adhere to. The disclosed methods may also provide for a test to ensure that arc sprayed surfaces are fully adhered to the substrate. Removing poorly adhered arc sprayed surfaces also helps reduce undesirable particle generation during the PDV process. After optimization, the textured surfaces have fewer, weak cantilevered structures and better surface cleanliness for film adhesion. Brittle materials, such as nitrides and silicides, including titanium nitride, tantalum nitride, tantalum silicide, tungsten silicide, etc. deposited on the optimized textured surfaces during the sputtering process will adhere better to a more structurally sound base. This results in shields and targets that reduce the amount of undesirable particle generation in a PVD sputter chamber.

The textured surfaces are optimized by blasting them with solid particles, or ice particles, that will not leave dry residue, such as frozen water. In one embodiment, the ice particles may be sublimable solid particles such as frozen carbon dioxide or frozen argon. Sublimable solid particles have an advantage in that they melt from a solid to a gas without forming a liquid on the textured surface. The ice particles are blasted onto the textured surfaces to physically remove the cantilevered structures, loose material, and contaminants from the textured surfaces. After blasting the textured surfaces, any embedded ice particles therein will melt, or in the case of sublimable solid particles, evaporate.

The ice particles may be blasted using any apparatus or device configured for particle blasting or particle blast cleaning. Such devices may be commercially available dry ice cleaning machines. A simplified description of such devices is provided in the following paragraphs merely by way of illustration and to provide a general understanding of such devices. Differences in particle blasting devices do not affect the scope of the present invention. More information about particle blasting devices may be found in U.S. Pat. No. 6,890,246 issued May 10, 2005 titled DRY-ICE BLAST DEVICE and in U.S. Pat. No. 8,277,288 issued Oct. 2, 2012 titled PARTICLE BLAST CLEANING APPARATUS WITH PRESSURIZED CONTAINER. Both patents are herein incorporated by reference.

A particle blasting device (not shown) may comprise a container, a feeder assembly, a drive assembly, and an exit port assembly. The container is configured to receive and hold the solid particles, such as carbon dioxide ice particles used to blast or clean surfaces, including the textured surfaces described above. The container may be sealed or pressurized. The container is also configured to transfer the ice particles from a lower end of the container to the feeder assembly. The feeder assembly is configured to convey the ice particles to the exit port assembly. The feeder assembly may have an auger that rotates in a direction toward the exit port assembly to push the ice particles toward the exit port assembly. The exit port assembly is configured to expel the ice particles from the apparatus. The exit port assembly may comprise a nozzle attached to a wand for directing and controlling the flow of the ice particles. Differences in nozzles do not affect the scope of the present invention. More information about nozzles for use with particle blasting devices may be found in U.S. Pat. No. 7,442,112 issued Oct. 28, 2008 titled NOZZLE FOR SPRAYING SUBLIMABLE SOLID PARTICLES ENTRAINED IN GAS FOR CLEANING SURFACE and in U.S. Pat. No. 7,762,869 issued Jul. 27, 2010 titled NOZZLE FOR SPRAYING SUBLIMABLE SOLD PARTICLES ENTRAINED IN GAS FOR CLEANING SURFACE. Both patents are herein incorporated by reference. The flow or spray of the ice particles may be facilitated or controlled by entraining the ice particles in a carrier gas. The carrier gas may be nitrogen ($N_2$) or clean, dry air. The carrier gas may be fed from a supply source that is fluidly connected to the particle blasting apparatus at any suitable location. Though not required, the carrier gas is typically introduced to the exit port assembly.

The ice particles may be blasted onto textured surfaces of the shield or target sidewalls and flanges using the nozzle. The ice particles may be blasted with sufficient momentum to abrade the cantilevered structures and other contamination from the textured surfaces. The flow of ice particles may be established in the nozzle while aiming the wand and attached nozzle away from the target assembly. Once a steady flow of particles is moving through the nozzle, the wand may be aimed at the textured surfaces at an approximate angle of 70° and waved side to side. The target assembly may be placed on an automated rotating table or tray and rotated continuously at about 1 rpm. The target assembly may go through two full rotations on the rotating table while the nozzle is aimed at the textured surfaces of the target assembly. If the textured surface has an undercut, vertical section, two or more additional rotations with a different nozzle may be employed. The undercut vertical section may be cleaned with a nozzle with a round tip and lower feed rate. The blasting creates optimized textured surfaces with fewer, weak cantilevered structures and better surface cleanliness for film adhesion. After the target assemblies are blasted with ice particles, the target assembly may be finished with an ultrasonic cleaning in de-ionized water.

Several process parameters may be varied in addition to those described above. The parameters include, but are not limited to nozzle type and feed rate and/or particle feed rate and blast pressure and/or carrier gas pressure. Optimal values for the process parameters may depend on the textured surface and/or particle blasting device. The feed rate may range from about 0.0 kg/min to about 2.0 kg/min. In another embodiment, the feed rate may range from 0.1 to about 1.0 kg/min. In yet another embodiment, the feed rate may be 0.18 kg/min. The blast pressure may vary with the pressure of the carrier gas. The air pressure may range from about 50 to about 250 psi. In another embodiment, the air pressure may range from about 75 to about 150 psi. In yet another embodiment, the air pressure may be about 110 psi. In another embodiment, the air and/or blast pressure may range from about 0 to about 140 psi. Suitable nozzles include, but are not limited to, fan nozzles, fragmenting nozzles, or multiple expansion ramp nozzles (MERN). The nozzle's volumetric capacity may range from about 20 to 60 cfm. In one embodiment, the capacity may range from 25 to about 50 cfm. Alternatively, the nozzle volumetric capacity may be about 25 cfm.

Accordingly, methods for optimizing textured target surfaces are disclosed. The methods may be used with target surfaces that have been texturized using any method, including but not limited to the bead blasting, grit blasting, plasma spraying, or twin-wire-arc spraying (TWAS) methods described above. After the surfaces are texturized, the target assembly may be conditioned to remove any oxide or stains on the packing plate and/or other target assembly surfaces. In one embodiment, the method may comprise spraying or blasting the textured surface with ice particles to form an optimized textured surface. The ice particles may be sublimable particles, such as frozen carbon dioxide or dry ice. In another embodiment, the ice particles may be argon. In another embodiment, the textured surface may be blasted with ice particles using a particle blasting device. The ice particles may be entrained in a carrier gas such as nitrogen or air. In another embodiment, the method may comprise reducing the amount of any cantilevered structures present in the textured surface to form an optimized textured surface.

In yet another embodiment, an optimized textured surface is disclosed wherein the textured surface was optimized using a method comprising blasting a textured surface with ice particles to form an optimized textured surface. The textured surface maybe texturized using at least one method selected from the group consisting of bead blasting, grit blasting, plasma spraying, twin-wire-arc spraying (TWAS), and combinations thereof. In yet another embodiment, the textured surface may comprise aluminum, aluminum alloys, and/or combinations thereof.

In another embodiment of the invention, a target assembly comprising a sputtering target with at least one sidewall and/or a flange with an optimized textured surface is disclosed. The sidewall and/or flange may be optimized using a method comprising blasting a textured surface with ice particles to form an optimized textured surface. The textured surface may be texturized using at least one method selected from the group consisting of bead blasting, grit blasting, plasma spraying, twin-wire-arc spraying (TWAS), and combinations thereof. The textured surface may comprise aluminum, aluminum alloys, and/or combinations thereof. In yet another embodiment, the amount of any cantilevered structures present in the textured surface was reduced to form the optimized textured surface.

EXAMPLES

Figure 1:
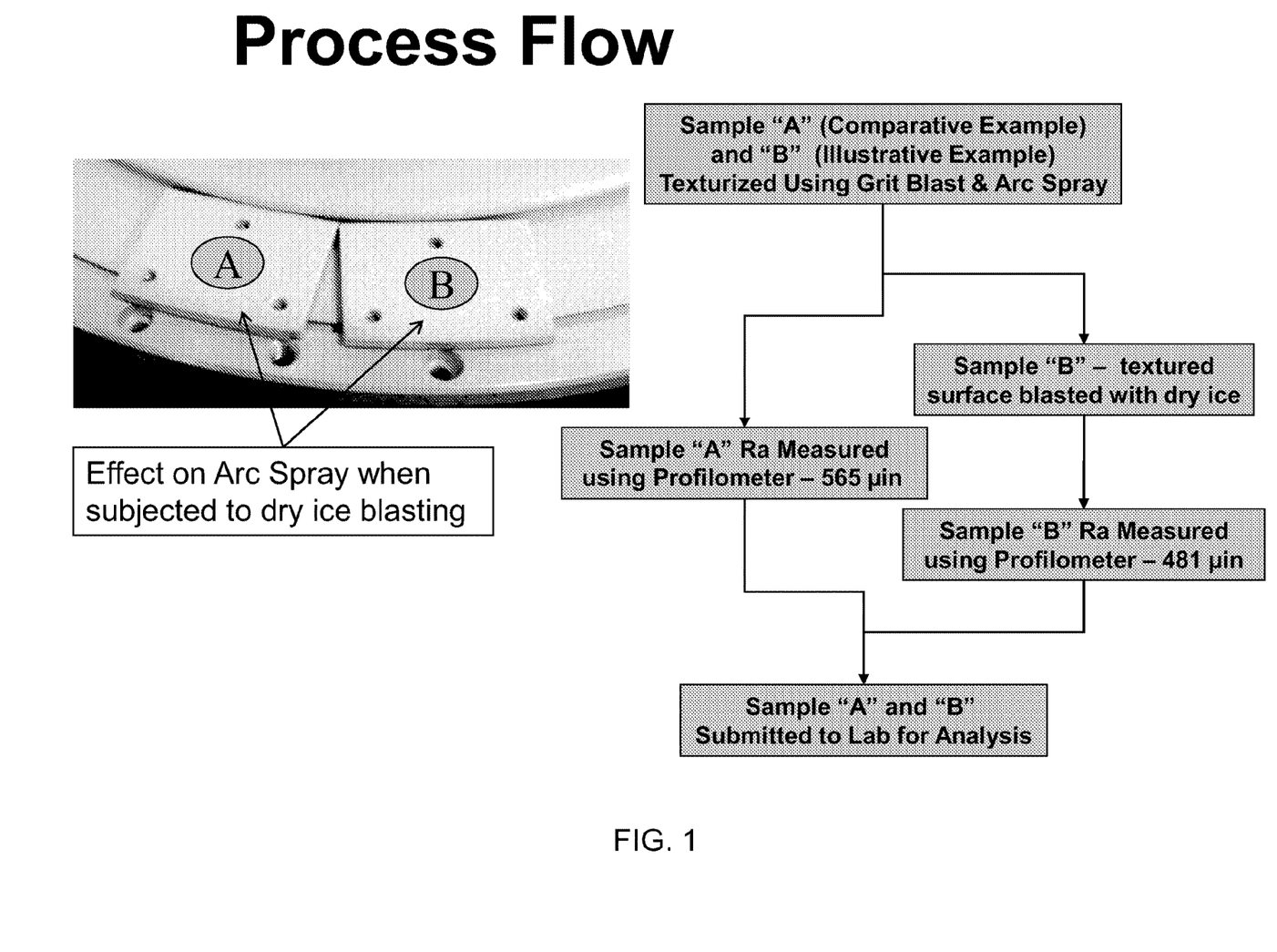
FIG. 1 is a flowchart of the process used to test a comparative example "Sample A" with an illustrative example of the invention, "Sample B".

Turning to FIG. 1, test coupons, referred to as Sample A and Sample B are shown. Test coupons were used to aid in testing and analysis. Although Sample A and Sample B are test coupons, any textured surface may be used in the present invention, including shields and target sidewalls and flanges. Both Sample A and Sample B were texturized using grit blasting and arc spraying.

The texturized surfaces of Sample B were blasted with dry ice particles using an i$^3$ MicroClean™ blasting apparatus available from Cold Jet, LLC (Loveland, Ohio). Various parameters of the blasting process may be varied when using the i$^3$ MicroClean™ blasting apparatus and similar devices, such as nozzle type, blast particle feed rate and blast pressure. The nozzle used was a 25 cfm (0.7 m$^3$/min) fan nozzle (model MC35). Adjustable parameters include feed rate and air pressure. The feed rate was 0.18 kg/min and the air pressure was 110 psi. Sample A did not receive the optimization treatment.

The surface roughness ($R_a$) of Sample A and Sample B were measured using a profilometer. The surface roughness of Sample A was 565 μin. The surface roughness of Sample B after dry ice blasting was 481 μin. The samples were then analyzed using energy dispersive X-ray (EDAX) analysis and a scanning electron microscope (SEM).

Figure 2:
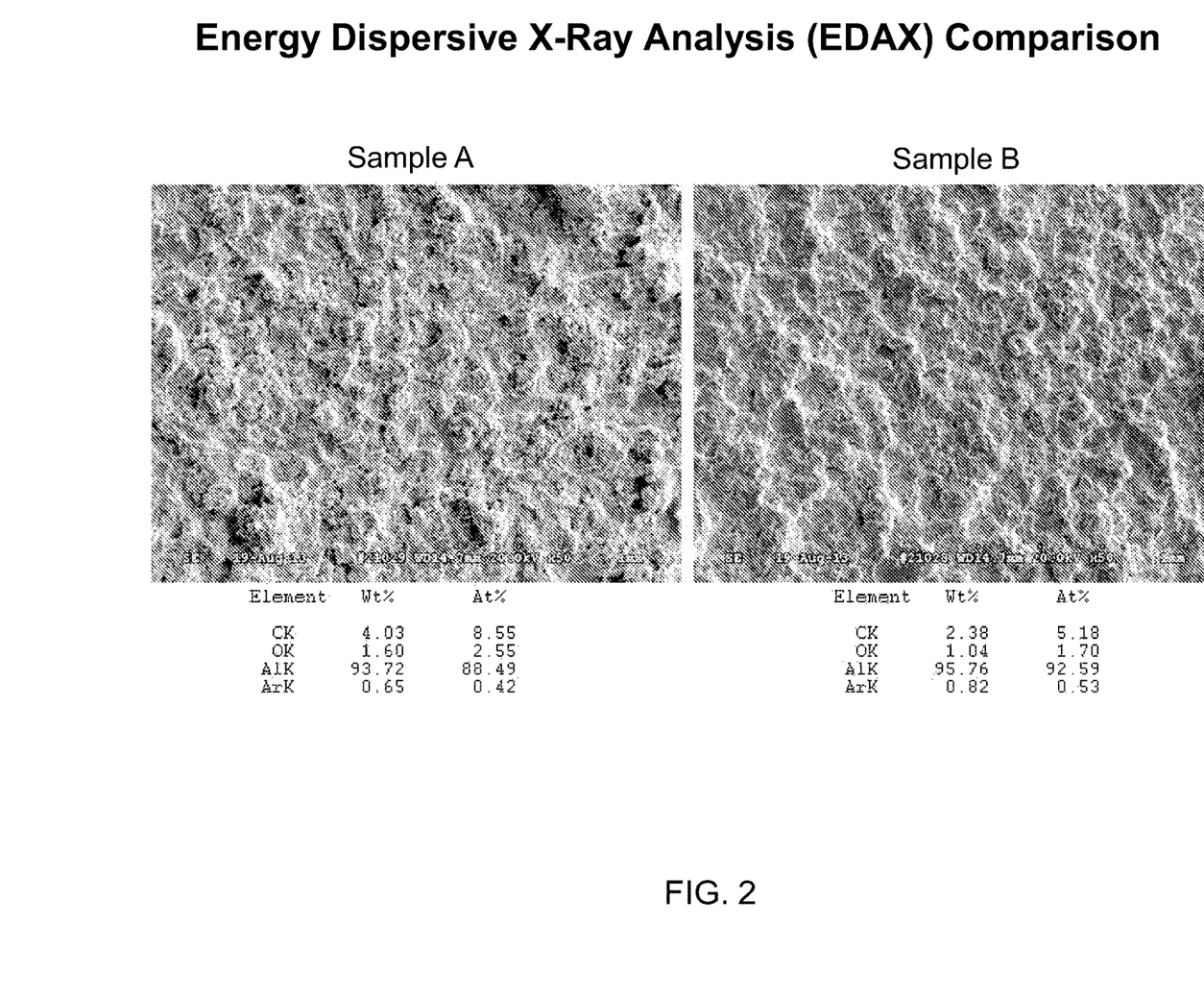
FIG. 2 is an energy dispersive X-ray (EDAX) analysis and comparison of Sample A and Sample B.
Figure 3:
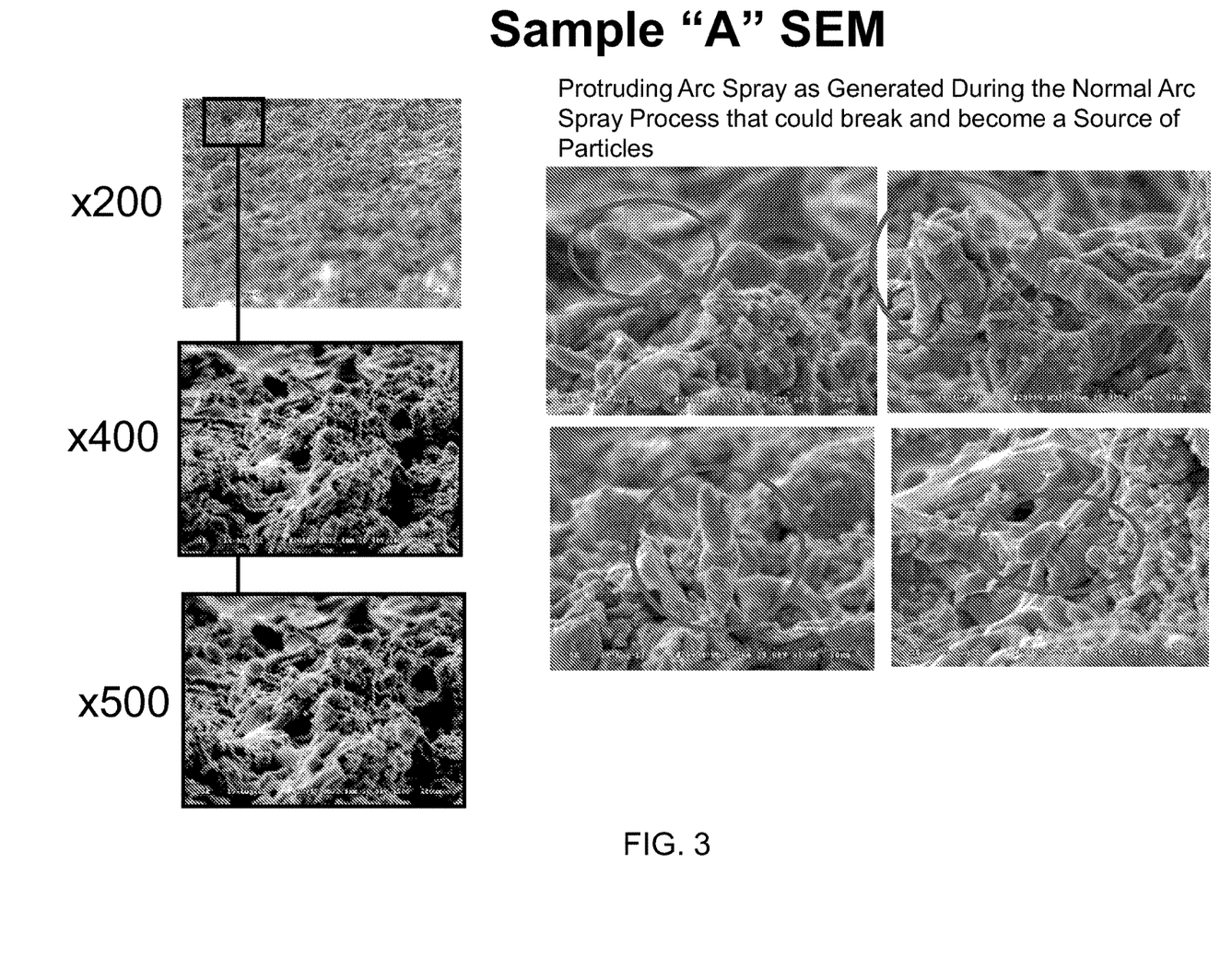
FIG. 3 shows multiple pictures of Sample A taken under a scanning electron microscope (SEM).
Figure 4:
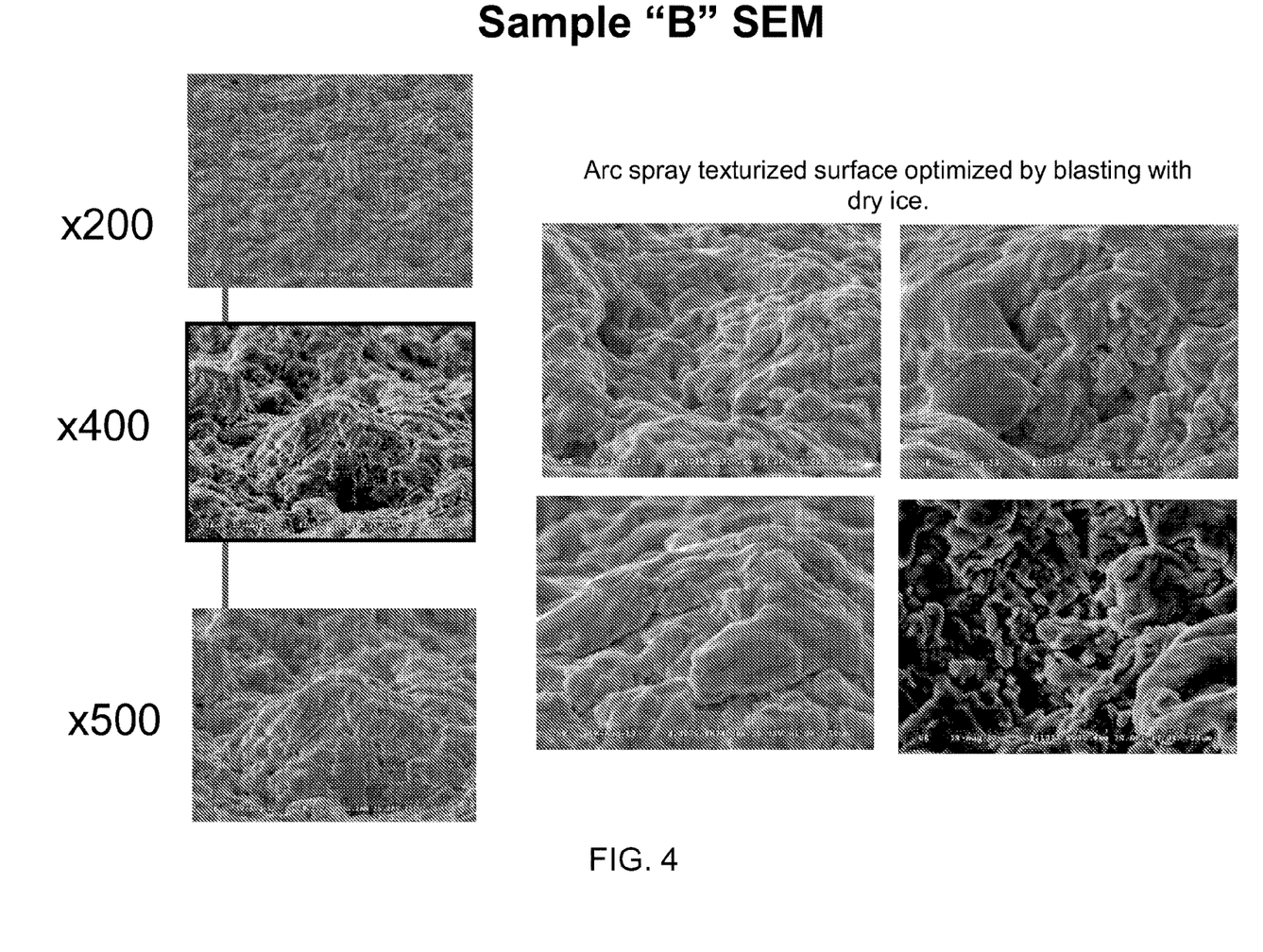
FIG. 4 shows multiple pictures of Sample B taken under a scanning electron microscope (SEM).
Figure 5:
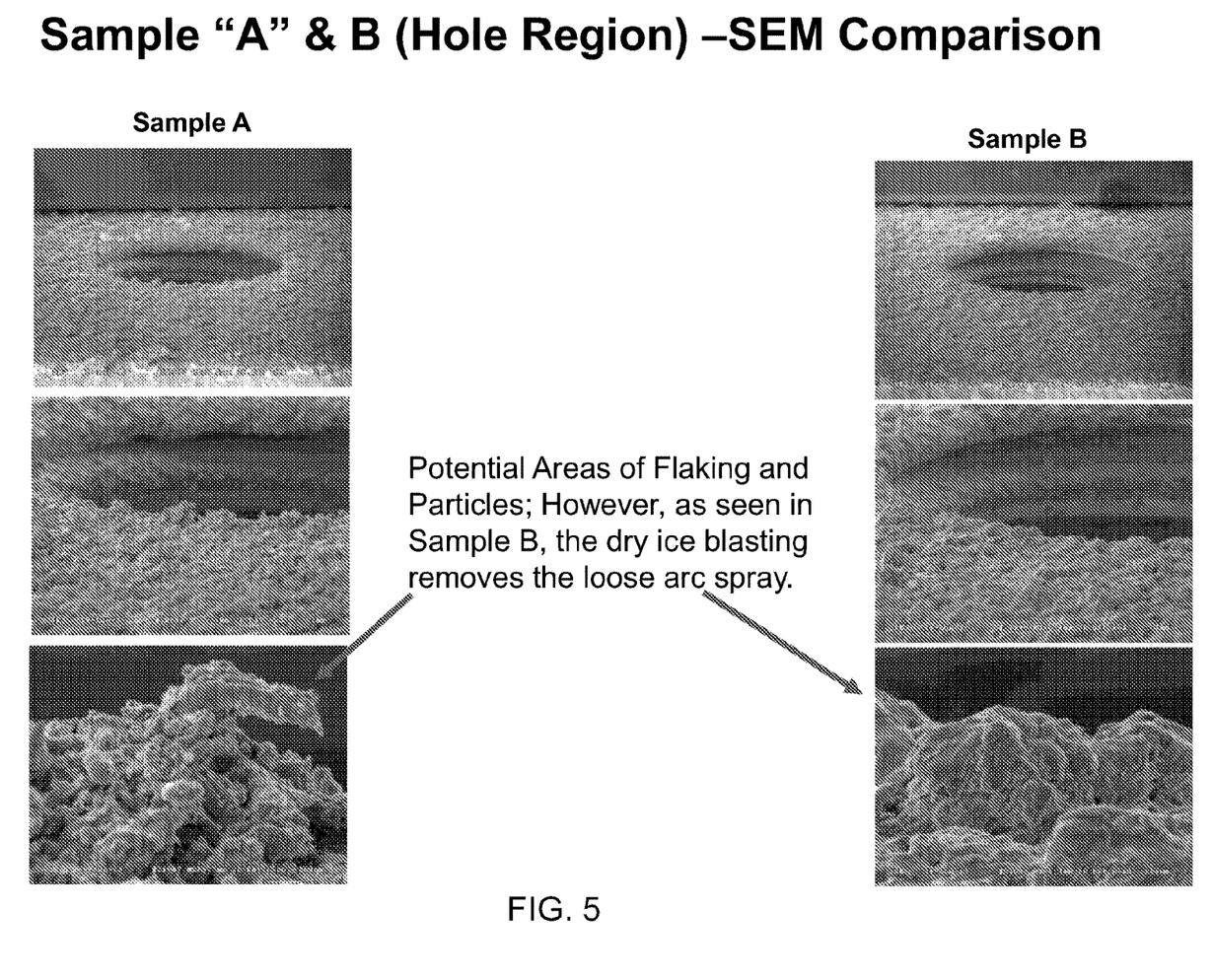
FIG. 5 is an SEM comparison of the hole region of Sample A and Sample B.

The EDAX results and comparisons for Samples A and B are shown in FIG. 2. The surface composition of Samples A and B are also shown in FIG. 2. FIG. 3 shows multiple pictures of Sample A taken under a scanning electron microscope (SEM). The circled areas in FIG. 3 show the cantilevered structures that may collect contaminants and/or break-off during the sputtering process. FIG. 4 shows multiple pictures of Sample B taken under a scanning electron microscope (SEM). The cantilevered structures and other possible contaminants have been removed from the optimized textured surfaces of Sample B. FIG. 5 is an SEM comparison of the hole region of Sample A and Sample B.

While this invention has been described in conjunction with the various exemplary embodiments and examples described above, it is evident that many alternatives, combinations, modifications and variations are apparent to those skilled in the art. Accordingly, the exemplary embodiments of the invention set forth above are intended to be illustrative, and not limiting. Various changes can be made without departing from the spirit and scope of this invention.

The invention claimed is:

1. A method of treating a surface in a sputter chamber to improve adhesion and retention of deposited particles thereon, said method comprising subjecting said surface to a texturizing treatment to form a textured surface, said texturizing treatment being selected from a group consisting of arc spraying, plasma spraying, bead blasting, and grit blasting; subsequently blasting said textured surface with ice particles to remove cantilevered structures present in said textured surface without disturbing the overall roughness.

2. The method of claim 1, wherein said ice particles are sublimable carbon dioxide or argon particles.

3. The method of claim 1, wherein said texturizing treatment is bead blasting.

4. The method of claim 1, wherein said textured surface is blasted with ice particles using a particle blasting device.

5. The method of claim 4, wherein said ice particles are entrained in a carrier gas.

6. The method of claim 5, wherein said carrier gas is nitrogen or air.

7. The method of claim 3 wherein said textured surface comprises aluminum, aluminum alloy, or combinations thereof.

* * * * *